(12) United States Patent
Tsutsui et al.

(10) Patent No.: US 12,557,260 B2
(45) Date of Patent: Feb. 17, 2026

(54) STACKED-FET SRAM CELL WITH BOTTOM pFET

(71) Applicant: INTERNATIONAL BUSINESS MACHINES CORPORATION, Armonk, NY (US)

(72) Inventors: Gen Tsutsui, Glenmont, NY (US); Shogo Mochizuki, Mechanicville, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 633 days.

(21) Appl. No.: 17/960,222

(22) Filed: Oct. 5, 2022

(65) Prior Publication Data
US 2024/0121933 A1 Apr. 11, 2024

(51) Int. Cl.
*H10B 10/00* (2023.01)
(52) U.S. Cl.
CPC .................................. *H10B 10/125* (2023.02)
(58) Field of Classification Search
CPC ...................................................... H10B 10/125
See application file for complete search history.

(56) References Cited

U.S. PATENT DOCUMENTS

| | | | |
|---|---|---|---|
| 6,808,971 B2 | 10/2004 | Bhattacharyya | |
| 8,174,058 B2 | 5/2012 | Marshall et al. | |
| 8,952,431 B2 | 2/2015 | Guo et al. | |
| 9,559,013 B1 | 1/2017 | Balakrishnan et al. | |
| 10,090,193 B1 | 10/2018 | Chanemougame et al. | |
| 10,304,832 B1 | 5/2019 | Chanemougame et al. | |
| 10,529,624 B2 | 1/2020 | Leobandung et al. | |
| 10,685,887 B2 | 6/2020 | Smith et al. | |
| 10,756,096 B2 | 8/2020 | Paul et al. | |
| 10,833,078 B2 | 11/2020 | Smith et al. | |

(Continued)

FOREIGN PATENT DOCUMENTS

| | | |
|---|---|---|
| CN | 119999349 A | 5/2025 |
| DE | 112023004174 T5 | 7/2025 |

(Continued)

OTHER PUBLICATIONS

International Search Report from PCT/CN2023/104040 dated Sep. 20, 2023. (9 pages).

(Continued)

*Primary Examiner* — Khaja Ahmad
(74) *Attorney, Agent, or Firm* — Tutunjian & Bitetto, P.C.; Kimberly Zillig

(57) ABSTRACT

A semiconductor structure is presented including a bottom field effect transistor (FET) including a plurality of bottom source/drain (S/D) epi regions, a top FET including a plurality of top S/D epi regions, a bonding dielectric layer disposed directly between the bottom FET and the top FET, and a node contact advantageously extending from a bottom S/D epi region of the plurality of bottom S/D epi regions of the bottom FET through the bonding dielectric layer and into the top FET. The bottom FET includes an inverter gate. The top FET electrically connects to back-end-of-line (BEOL) components and the bottom FET electrically connects to a backside power delivery network (BSPDN).

16 Claims, 14 Drawing Sheets

(56) References Cited

U.S. PATENT DOCUMENTS

| | | |
|---|---|---|
| 10,840,146 B1 | 11/2020 | Paul et al. |
| 10,868,008 B2 | 12/2020 | Peng et al. |
| 10,879,308 B1* | 12/2020 | Ando ................ H01L 21/02532 |
| 10,964,706 B2 | 3/2021 | Smith et al. |
| 11,037,905 B2 | 6/2021 | Wu et al. |
| 11,444,082 B2 | 9/2022 | Smith et al. |
| 2006/0237857 A1 | 10/2006 | Bertin et al. |
| 2009/0050941 A1 | 2/2009 | Yamazaki et al. |
| 2009/0079000 A1 | 3/2009 | Yamazaki et al. |
| 2011/0204428 A1 | 8/2011 | Erickson et al. |
| 2011/0248349 A1 | 10/2011 | Christensen et al. |
| 2012/0032274 A1 | 2/2012 | Erickson et al. |
| 2014/0332862 A1 | 11/2014 | Guo et al. |
| 2019/0172828 A1* | 6/2019 | Smith .................... H10D 88/00 |
| 2019/0181224 A1 | 6/2019 | Zhang et al. |
| 2019/0229021 A1* | 7/2019 | Ando ................... H10D 62/151 |
| 2020/0006366 A1* | 1/2020 | Reznicek ............... H10B 41/30 |
| 2020/0035691 A1 | 1/2020 | Reznicek et al. |
| 2020/0105891 A1* | 4/2020 | Lilak .................. H10D 30/6757 |
| 2020/0203343 A1 | 6/2020 | Zhu et al. |
| 2020/0286793 A1* | 9/2020 | Zhang .................... H10D 84/85 |
| 2021/0043522 A1 | 2/2021 | Chanemougame et al. |
| 2021/0043630 A1 | 2/2021 | Liebmann et al. |
| 2021/0202500 A1 | 7/2021 | Chanemougame et al. |
| 2022/0181453 A1 | 6/2022 | Liebmann et al. |
| 2022/0415906 A1* | 12/2022 | Park ..................... H10D 62/118 |

FOREIGN PATENT DOCUMENTS

| | | |
|---|---|---|
| GB | 2638609 A | 8/2025 |
| WO | 2024/074062 A1 | 4/2024 |

OTHER PUBLICATIONS

German Patent and Trademark Office, "Office Action," Jul. 14, 2025, 12 Pages, DE Application No. 112023004174.1.

Huang et al., "3-D Self-aligned Stacked NMOS-on-PMOS Nanoribbon Transistor for Continued Moore's Law Scaling", 2020 IEEE International Electron Devices Meeting (IEDM), San Francisco, CA, USA, Dec. 2020, 4 pages, doi: 10.1109/IEDM13553.2020.9372066.

Y. Huang et al., "Solution Processed Highly Uniform and Reliable Low Voltage Organic FETs and Facile Packaging for Handheld Multi-ion Sensing", 2019 IEEE International Electron Devices Meeting (IEDM), Dec. 2019, 4 pages, doi: 10.1109/IEDM19573.2019.8993445.

\* cited by examiner

STACKED-FET SRAM CELL WITH BOTTOM pFET

BACKGROUND

The present invention relates generally to semiconductor devices, and more specifically, to constructing a stacked field effect transistor (FET) static random access memory (SRAM) cell with bottom p-type FET (pFET).

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

Fin-based active devices, primarily transistors, are extensively applied for the production of standard cells and other active device configurations processed in the front-end-of-line (FEOL) part of the integrated circuit fabrication process, and include FinFETs, as well as more recent devices based on nanowires or nanosheets. An example technology involves the use of buried interconnect rails in the FEOL. Buried power rails (BPRs) can directly connect the transistors in the FEOL to a power delivery network located entirely on the back side of an integrated circuit chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the source/drain contact level of the chip, also referred to as the "middle end of line," which is a transition between the active devices in the FEOL, and the interconnect levels (M1, M2, etc.) in the back-end-of-line (BEOL).

Some implementations of this approach have a number of drawbacks. As the rails are buried underneath the active devices, the size of the buried power rail (BPR) is limited by the cell-to-cell space between two nearby active regions. As cell height scales down, so does the cell-to-cell space, the buried power rail size decreases, and its resistance increases, which degrades the circuit performance.

To achieve better performance, contact optimization over the source/drain (S/D) epitaxy is needed, especially for FinFET technology and other technologies beyond FinFET, such as nanosheet, where the S/D epi can be tall, and a wrap around contact which contacts not only the top and also the sidewall surfaces of the S/D epi is needed to maximize the contact area and reduce the contact resistance. Contact resistance is a contributor of the total resistance of a transistor as transistor device scaling continues beyond (e.g., below) the 10 nanometer (nm) technology node. The term "contact resistance" is a measure of the ease with which current can flow across a metal-semiconductor interface. Contact resistivity (RhoC) reduction alone is not enough to reduce external resistance to its target for 10 nm technology node and beyond, and a new contact structure is needed to increase the contact area. Backside contacts can be considered an ideal contact structure. However, conventional backside contacts are known to cause issues in certain semiconductor manufacturing processes.

SUMMARY

In accordance with an embodiment, a semiconductor structure is provided. The semiconductor structure includes a bottom field effect transistor (FET) including a plurality of bottom source/drain (S/D) epi regions, a top FET including a plurality of top S/D epi regions, a bonding dielectric layer disposed directly between the bottom FET and the top FET, and a node contact extending from a bottom S/D epi region of the plurality of bottom S/D epi regions of the bottom FET through the bonding dielectric layer and into the top FET.

In accordance with another embodiment, a semiconductor structure is provided. The semiconductor structure includes a bonding dielectric layer disposed directly between a bottom field effect transistor (FET) and a top FET and a node contact extending from the bottom FET through the bonding dielectric layer and into the top FET to electrically connect to an inverter gate.

In accordance with yet another embodiment, a method for forming a semiconductor structure is provided. The method includes forming bottom nanosheets stacks between a plurality of bottom source/drain (S/D) epi regions disposed over sacrificial placeholders, performing a p-type field effect transistor (pFET) cut, depositing a sacrificial material within the pFET cut, forming a gate cap over the sacrificial material to form a bottom FET, forming a bonding dielectric layer over the bottom FET, forming top nanosheet stacks over the bonding dielectric layer and between a plurality of top S/D epi regions, removing sacrificial layers from the top and bottom nanosheet stacks to define first openings, depositing a replacement metal gate within the first openings, forming a gate cut and a node contact, the node contact extending from the bottom FET through the bonding dielectric layer and into the top FET, selectively removing the sacrificial placeholders and the sacrificial material to define second openings, and filling the second openings with a cross couple.

In one preferred aspect, the bottom FET includes an inverter gate.

In another preferred aspect, a gate cap is disposed on top of a bottom pFET gate metal.

In yet another preferred aspect, the inverter gate directly contacts several of the plurality of bottom S/D epi regions.

In one preferred aspect, the node contact is vertically aligned with a portion of the inverter gate.

In another preferred aspect, the top FET electrically connects to back-end-of-line (BEOL) components and wherein the bottom FET electrically connects to a backside power delivery network (BSPDN).

In another preferred aspect, a bitline (BL) directly contacts a top S/D epi region of the plurality of top S/D epi regions.

In another preferred aspect, a wordline (WL) directly contacts a metal gate disposed in the top FET.

In yet another preferred aspect, a gate cap directly contacts a cross-couple in the bottom FET.

In yet another preferred aspect, a gate cap is disposed on top of a bottom pFET gate metal.

The advantages of the present invention include producing transistors that consume less power, have better performance, occupy less area on a wafer, and reduce cost in semiconductor manufacturing. The advantages of the present invention further include improving the backside contact for backside power rail and backside power delivery network technology by providing methods and devices for constructing a stacked-FET SRAM with a bottom pFET by advantageously electrically connecting a node contact and inverter gate (cross-couple) by replacing the pFET under the pass-gate by a conductor.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for advantageously constructing a stacked field effect transistor (FET) static random access memory (SRAM) with a bottom p-type FET (pFET) by electrically connecting a node contact and inverter gate (cross-couple) by replacing the pFET under the pass-gate by a conductor. The stacked FET architecture advantageously includes a top FET bonded to a bottom FET by a bonding dielectric layer. The bottom FET advantageously includes the node contact and the inverter gate, such that all the transistor physical parameters, such as gate length, spacer thickness, and contact size, can be advantageously optimized for better transistor speed and/or lower power. Unlike horizontal transistors, much of this structural tuning is beneficial because it doesn't affect the transistor pitch (distance between transistors). In the exemplary stacked FETs with nanosheets described herein, integrated circuit (IC) vendors advantageously have the ability to vary the widths of the nanosheets in the transistor. For example, a nanosheet with a wider sheet provides more drive current and performance. A narrow nanosheet has less drive current, but takes up a smaller area.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
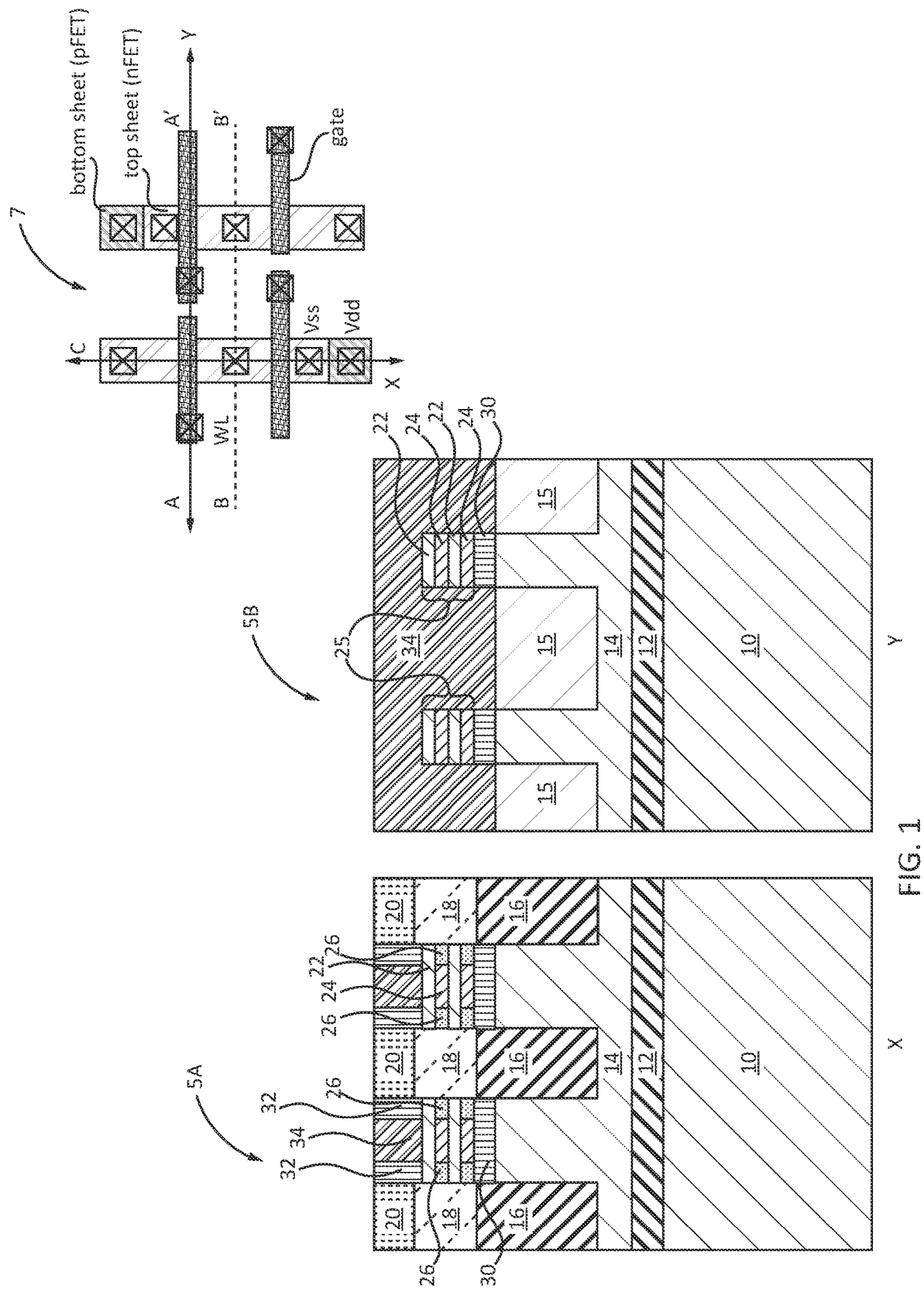
FIG. 1 is a cross-sectional view of a semiconductor structure including bottom nanosheet stacks formed over a substrate, where inner spacers, bottom sacrificial placeholders, source/drain (S/D) epi regions, and an interlayer dielectric (ILD) are also formed adjacent the bottom nanosheet stacks, in accordance with an embodiment of the present invention.

FIG. 1 is a cross-sectional view of a semiconductor structure including bottom nanosheet stacks formed over a substrate, where inner spacers, bottom sacrificial placeholders, source/drain (S/D) epi regions, and an interlayer dielectric (ILD) are also formed adjacent the bottom nanosheet stacks, in accordance with an embodiment of the present invention.

In various example embodiments, structure 5A includes bottom nanosheet stacks 25 that are formed over a substrate 10. An etch stop layer 12 and a silicon (Si) layer 14 are formed between the substrate 10 and the bottom nanosheet stacks 25. The bottom nanosheet stacks 25 include alternating layers of a first semiconductor material (or layer) 22 and a second semiconductor material (or layer) 24. The first semiconductor material 22 can be, e.g., silicon (Si) and the second semiconductor material 24 can be, e.g., silicon germanium (SiGe).

In the Y-cut direction, in structure 5B, the bottom nanosheet stacks 25 are formed over a bottom dielectric isolation (BDI) layer 30. Shallow trench isolation (STI) regions 15 are formed between the fins formed in the Si layer 14. Dummy gates 34 are also formed over the nanosheet stacks 25.

In the X-cut direction, in structure 5A, the dummy gates 34 are formed between spacers 32. The Si layer 14 accommodates bottom sacrificial placeholders 16. Bottom source/drain (S/D) epi regions 18 are formed over the bottom sacrificial placeholders 16. Interlayer dielectric (ILD) is deposited and planarized (e.g., by chemical mechanical polishing (CMP)) such that ILD regions 20 are formed over the bottom S/D epi regions 18. Regarding the bottom nanosheet stacks 25, inner spacers 26 are formed between the first semiconductor material (or layer) 22. The bottom nanosheet stacks 25 rest on the BDI layer 30.

The sidewalls of the BDI layer 30 directly contact the sidewalls of the bottom sacrificial placeholders 16. The top surface of the BDI layer 30 directly contacts the bottommost inner spacers 26. The bottom sacrificial placeholders 16 are vertically aligned with the bottom S/D epi regions 18, and with the ILD regions 20. The bottom nanosheet stacks 25 are vertically offset from the bottom sacrificial placeholders 16.

The top view 7 illustrates the bottom sheet (pFET) and the top sheet (nFET). The top view 7 depicts the stacked-FET with two adjacent diffusions in parallel. The two active gates are formed perpendicular to the diffusions.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Referring to, e.g., the nanosheet stack 25, the first semiconductor material 22 can be the first layer in a stack of sheets of alternating materials. The nanosheet stack 25 thus includes first semiconductor materials (or layers) 22 and second semiconductor materials (or layers) 24. Although it is specifically contemplated that the first semiconductor materials 22 can be formed from Si and that the second semiconductor materials 24 can be formed from silicon germanium, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials 22/24 can be deposited by any appropriate mechanism. It is specifically contemplated that the first and second semiconductor materials 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

The inner spacers 26 can include any of one or more of SiN, SiBN, SiCN and/or SiBCN films.

The ILD regions 20 can be any suitable material, such as, for example, porous silicates, carbon doped oxides, silicon dioxides, silicon nitrides, silicon oxynitrides, or other dielectric materials. Any known manner of forming the ILD regions 20 can be utilized. The ILD regions 20 can be formed using, for example, CVD, PECVD, ALD, flowable CVD, spin-on dielectrics, or PVD.

The BDI layer 30 can include, e.g., SiC, SiOC, etc. The BDI layer 30 can be deposited by, e.g., ALD with an anisotropic etch back.

The bottom S/D epi regions 18 can be of the same or different materials for pFET and nFET devices, and can be either in-situ doped with appropriate polarity dopants (B for pFET and P for nFET devices) or doped by ion implantation.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Regarding various dielectrics or dielectric layers (such as the bottom sacrificial placeholders 16) discussed herein, the dielectrics can include, but are not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 2:
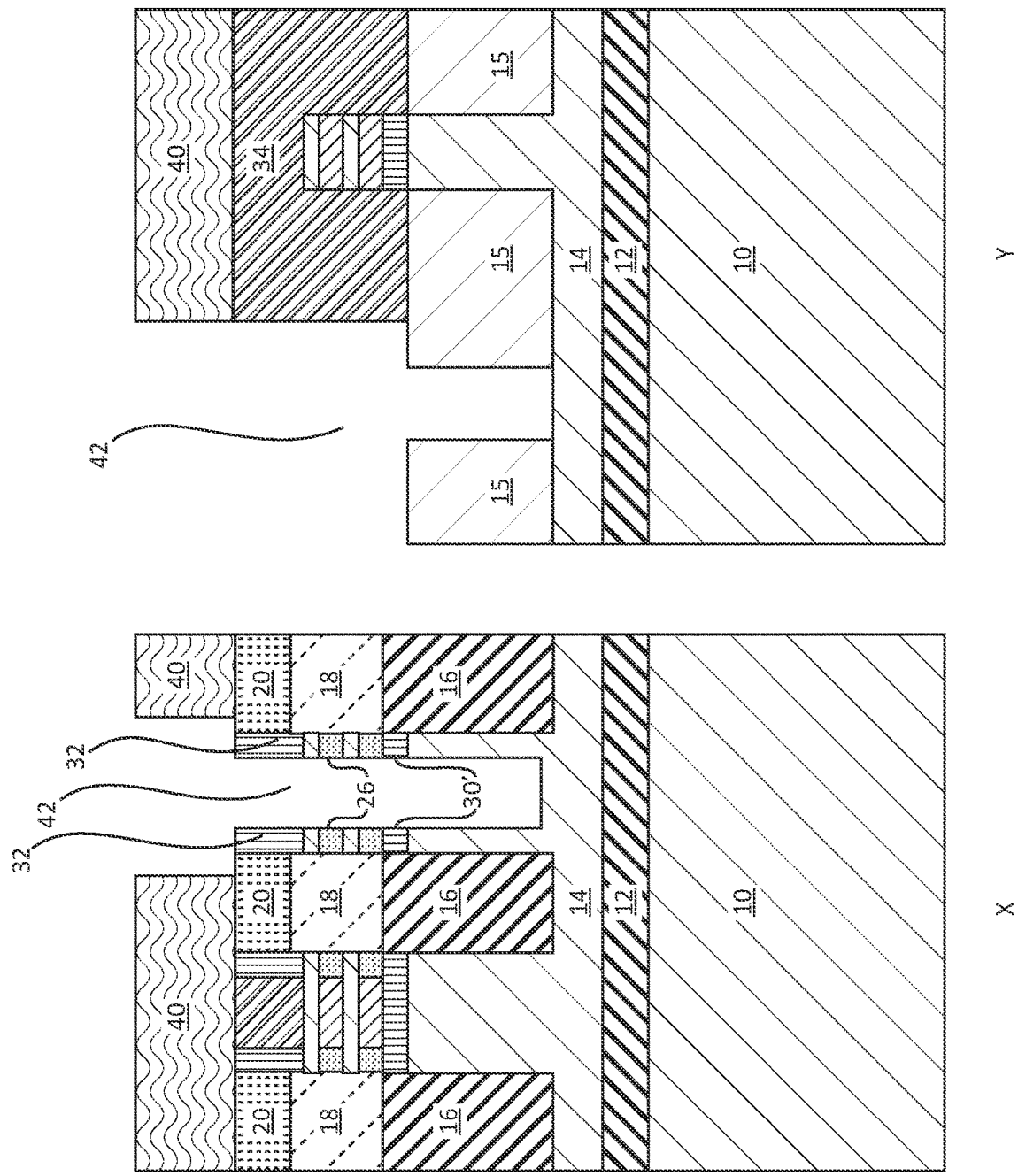
FIG. 2 is a cross-sectional view of the semiconductor structure of FIG. 1 where a mask layer (such as an organic planarization layer (OPL)) is deposited and patterned, and a p-type field effect transistor (pFET) cut takes place, in accordance with an embodiment of the present invention.

FIG. 2 is a cross-sectional view of the semiconductor structure of FIG. 1 where a mask layer (such as an organic planarization layer (OPL)) is deposited and patterned, and a p-type field effect transistor (pFET) cut takes place, in accordance with an embodiment of the present invention.

In various example embodiments, a mask layer 40 is deposited and patterned, and a p-type field effect transistor (pFET) cut 42 takes place. The pFET cut 42 extends well into a fin formed by the Si layer 14. BDI sections 30' of the BDI layer 30 remain, as well as the inner spacers 26 and the spacers 32 adjacent the dummy gate 34.

The mask layer 40 can be OPL, which includes an organic material, such as a polymer. The thickness of the OPL 40 can be in a range from about 10 nm to about 300 nm. In one example, the thickness of the OPL 40 is about 100 nm-150 nm.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 3:
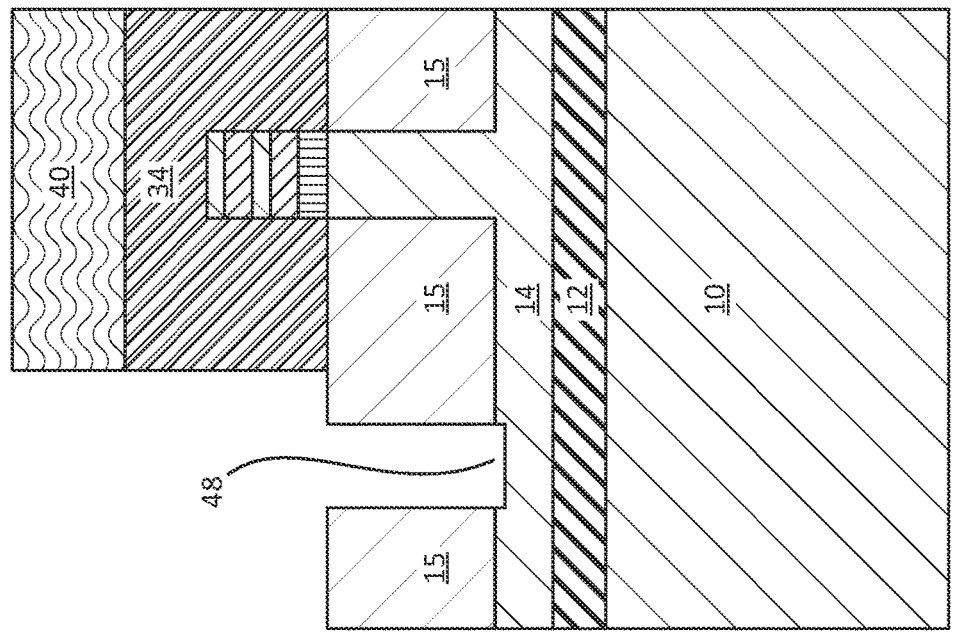
FIG. 3 is a cross-sectional view of the semiconductor structure of FIG. 2 where a lateral etch is performed, in accordance with an embodiment of the present invention.
Figure 3:
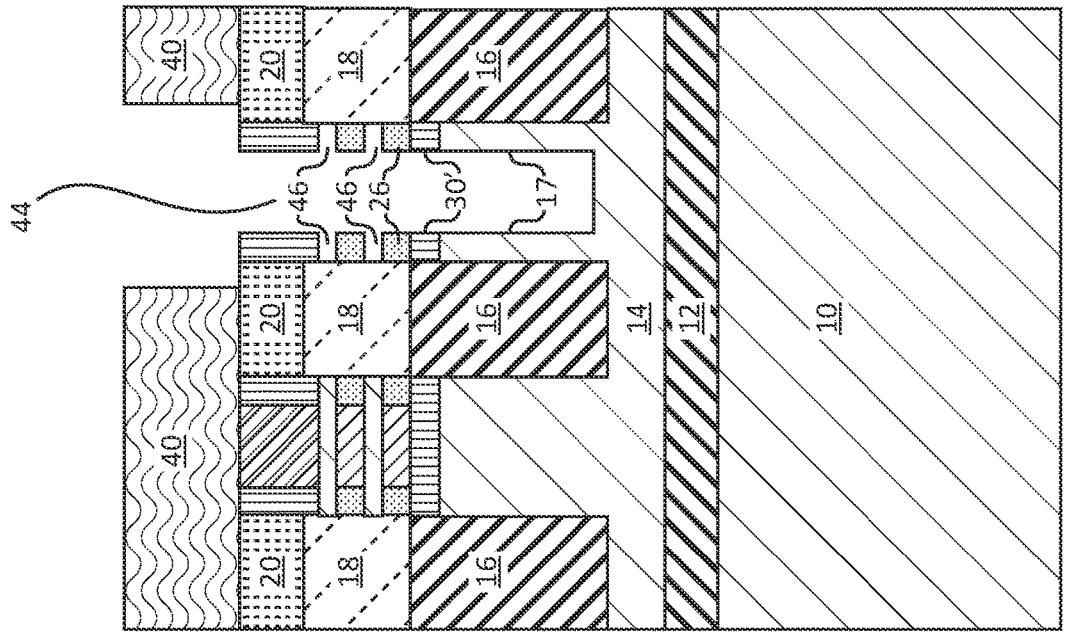

FIG. 3 is a cross-sectional view of the semiconductor structure of FIG. 2 where a lateral etch is performed, in accordance with an embodiment of the present invention.

In various example embodiments, a lateral etch 44 is performed such that Si portions between the inner spacers 26 and Si portions below the BDI sections 30' of the BDI layer 30 are selectively removed. The sidewalls 17 of the bottom sacrificial placeholders 16 are also exposed. The areas between the inner spacers 26 are designated as 46 in the X-cut direction. In the Y-cut direction, a further recess 48 is present in the Si layer 14.

Figure 4:
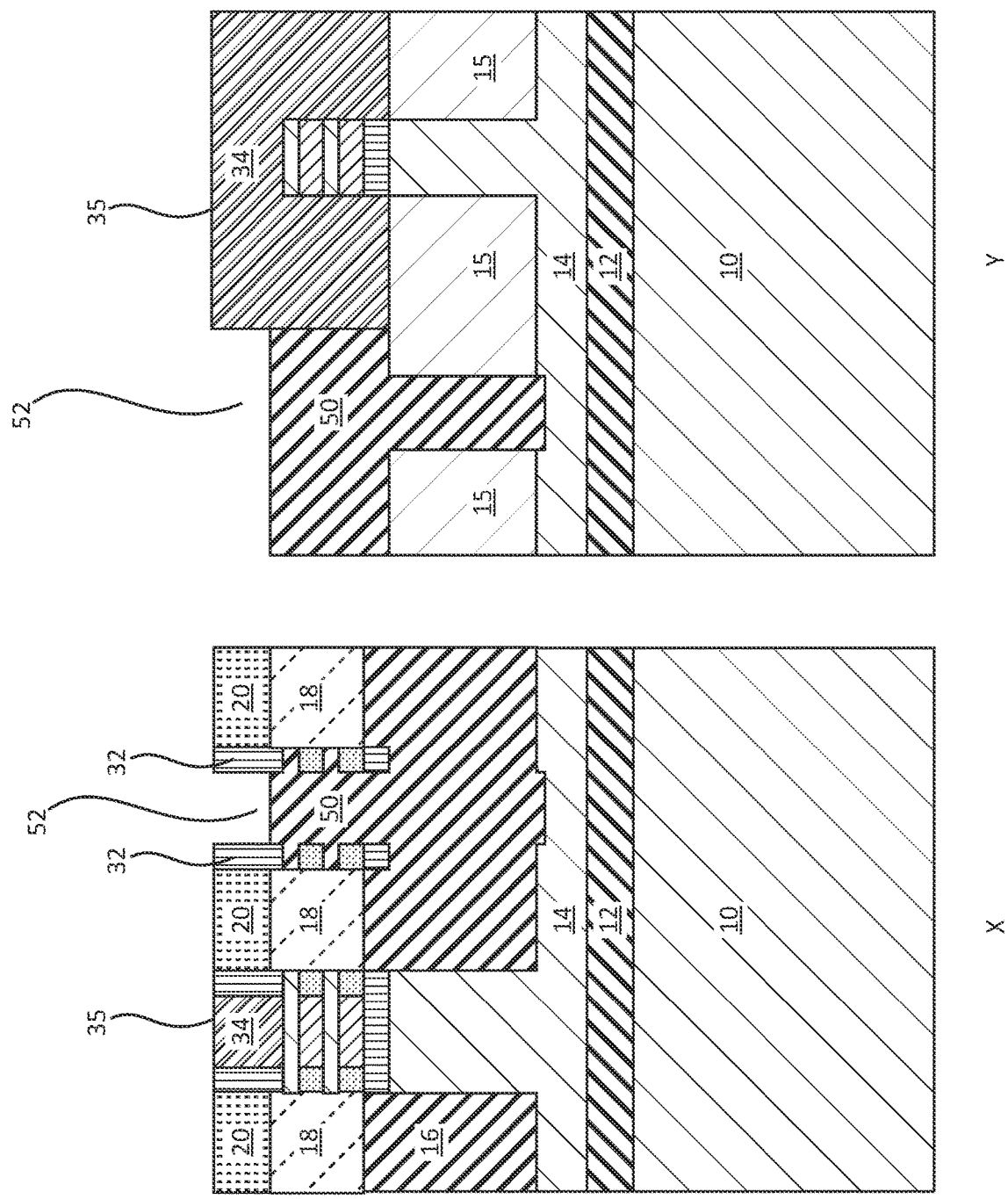
FIG. 4 is a cross-sectional view of the semiconductor structure of FIG. 3 where the OPL is selectively removed and a sacrificial material is deposited, in accordance with an embodiment of the present invention.

FIG. 4 is a cross-sectional view of the semiconductor structure of FIG. 3 where the OPL is selectively removed and a sacrificial material is deposited, in accordance with an embodiment of the present invention.

In various example embodiments, the mask layer 40 is selectively removed and a sacrificial material 50 is deposited. The sacrificial material 50 is recessed such that an opening 52 is formed over the sacrificial material 50 in both the X-cut and the Y-cut directions. The removal of the mask layer 40 exposed the top surface 35 of the dummy gate 34, as well as the top surfaces of the spacers 32 and the ILD regions 20.

The sacrificial material 50 can be composed of the same material as the bottom sacrificial placeholders 16 and can include various dielectrics or dielectric layers as discussed above.

Figure 5:
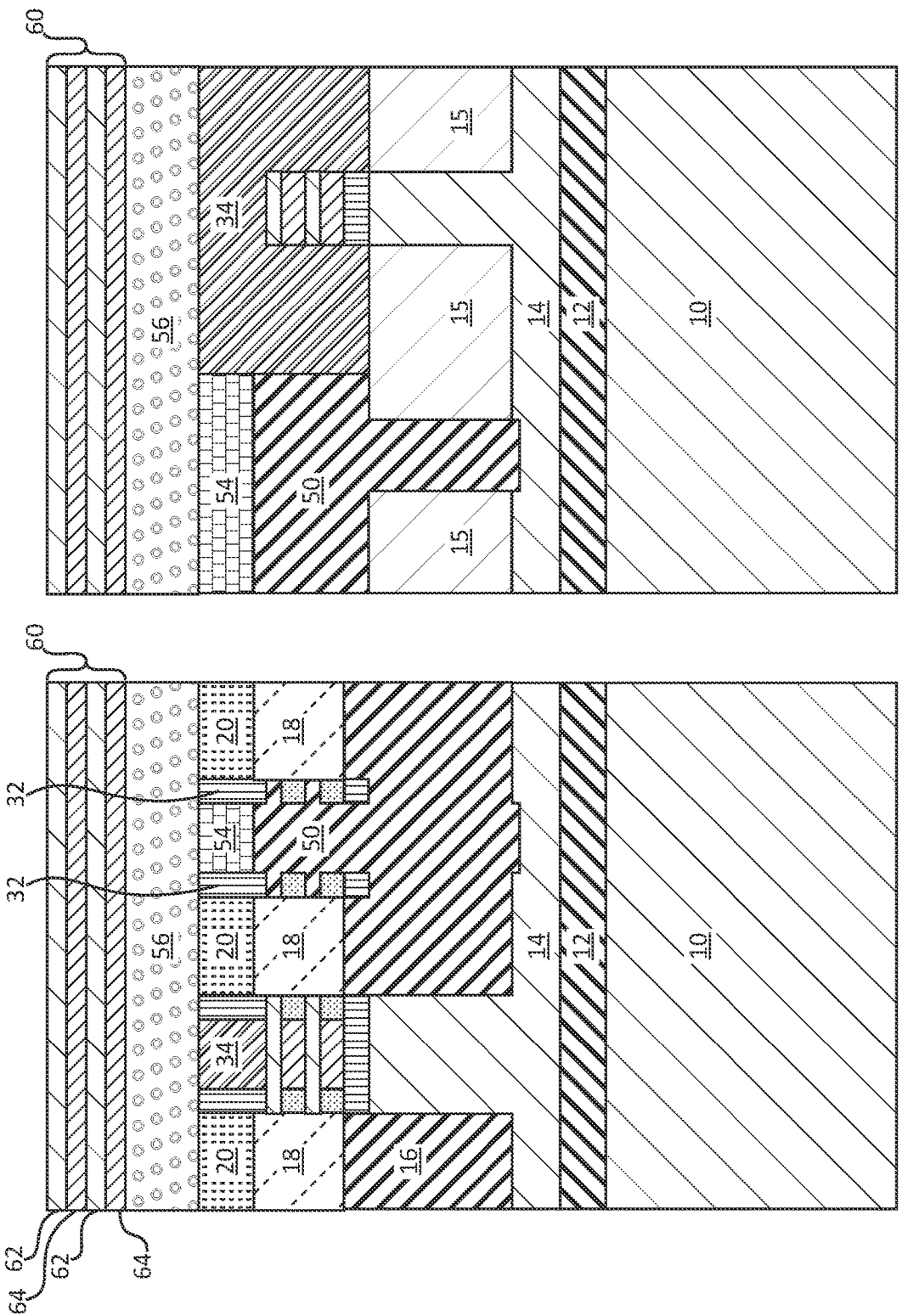
FIG. 5 is a cross-sectional view of the semiconductor structure of FIG. 4 where a dielectric capping layer is formed, and nanosheet layers for a top device are bonded to the bottom device through a dielectric-to-dielectric bonding process, in accordance with an embodiment of the present invention.

FIG. 5 is a cross-sectional view of the semiconductor structure of FIG. 4 where a dielectric capping layer is formed, and nanosheet layers for a top device are bonded to the bottom device through a dielectric-to-dielectric bonding process, in accordance with an embodiment of the present invention.

In various example embodiments, a dielectric cap 54 is formed over the recessed sacrificial material 50, a nanosheet layer 60 is then bonded to the bottom device layer using a dielectric-to-dielectric bonding process. The layer 56 represents the bonding oxide. The dielectric cap 54 is planarized (by, e.g., CMP) such that it is flush with a top surface 35 of the dummy gate 34 and with the top surface of the spacers 32. The bottom stacked-FET can be a pFET. The bonding dielectric layer 56 separates the bottom stacked-FET from the top-stacked FET which will be constructed from this point on. The top-stacked FET starts with the top nanosheet stacks 60 including alternating layers of a first semiconductor material 62 and a second semiconductor material 64. The top-stacked FET can be an nFET.

Figure 6:
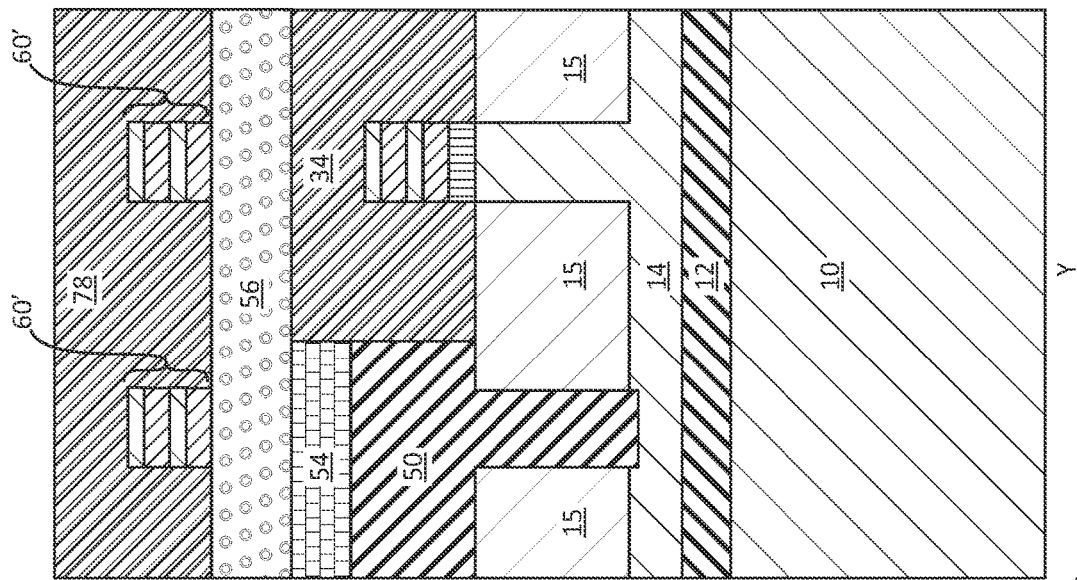
FIG. 6 is a cross-sectional view of the semiconductor structure of FIG. 5 where top nanosheet stacks are formed where inner spacers, source/drain (S/D) epi regions, and an interlayer dielectric (ILD) are also formed adjacent the top nanosheet stacks, in accordance with an embodiment of the present invention.
Figure 6:
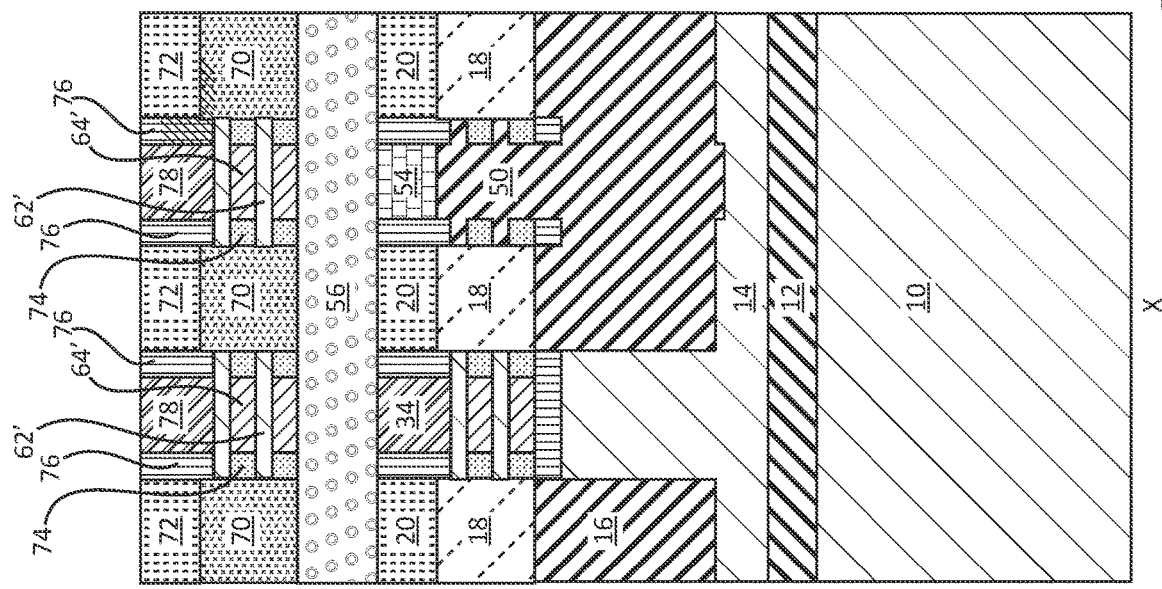

FIG. 6 is a cross-sectional view of the semiconductor structure of FIG. 5 where top nanosheet stacks are formed where inner spacers, source/drain (S/D) epi regions, and an interlayer dielectric (ILD) are also formed adjacent the top nanosheet stacks, in accordance with an embodiment of the present invention.

In various example embodiments, in the X-cut structure, top nanosheet stacks 60' are formed over the bonding dielectric layer 56. The top nanosheet stacks 60' include alternating layers of a first semiconductor material (or layer) 62' and a second semiconductor material (or layer) 64'. The first semiconductor material 62' can be, e.g., silicon (Si) and the second semiconductor material 64' can be, e.g., silicon germanium (SiGe).

In the X-cut direction, the dummy gates 78 are formed between the spacers 76. The top source/drain (S/D) epi regions 70 are formed over the bonding dielectric layer 56. ILD is deposited and planarized (e.g., by chemical mechanical polishing (CMP)) such that ILD regions 72 are formed over the top S/D epi regions 70. Regarding the top nanosheet stacks 60', inner spacers 74 are formed between the first semiconductor material (or layer) 62'.

In the Y-cut direction, dummy gates 78 are also formed over the nanosheet stacks 60'.

Figure 7:
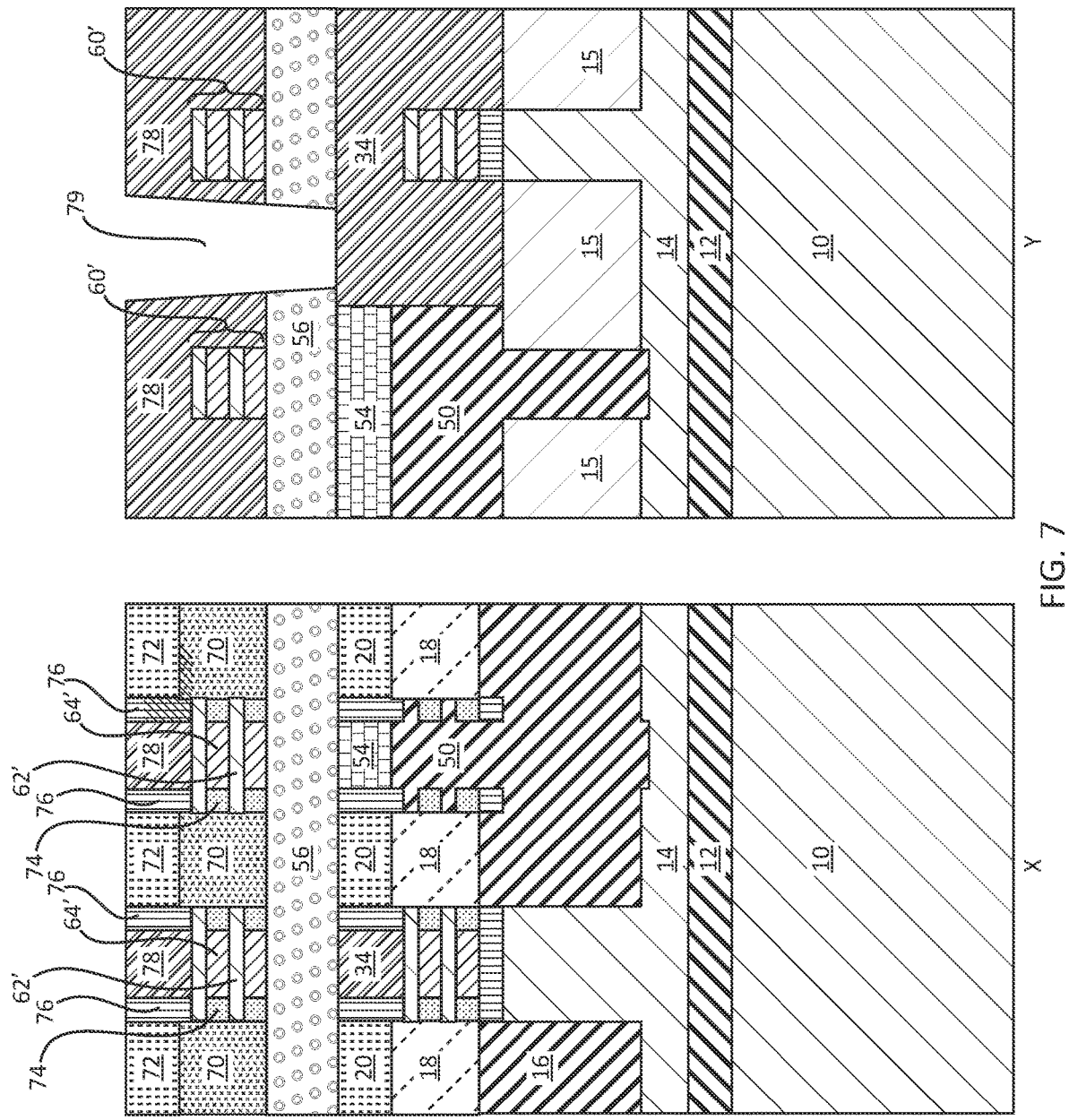
FIG. 7 is a cross-sectional view of the semiconductor structure of FIG. 6 where a replacement metal gate (RMG) opening is formed, in accordance with an embodiment of the present invention.

FIG. 7 is a cross-sectional view of the semiconductor structure of FIG. 6 where a replacement metal gate (RMG) opening is formed, in accordance with an embodiment of the present invention.

In various example embodiments, a replacement metal gate (RMG) opening 79 is formed and visible in the Y-cut direction. The RMG opening 79 extends through the bonding dielectric layer 56 to a top surface of the dummy gate 34 of the bottom-stacked FET.

Figure 8:
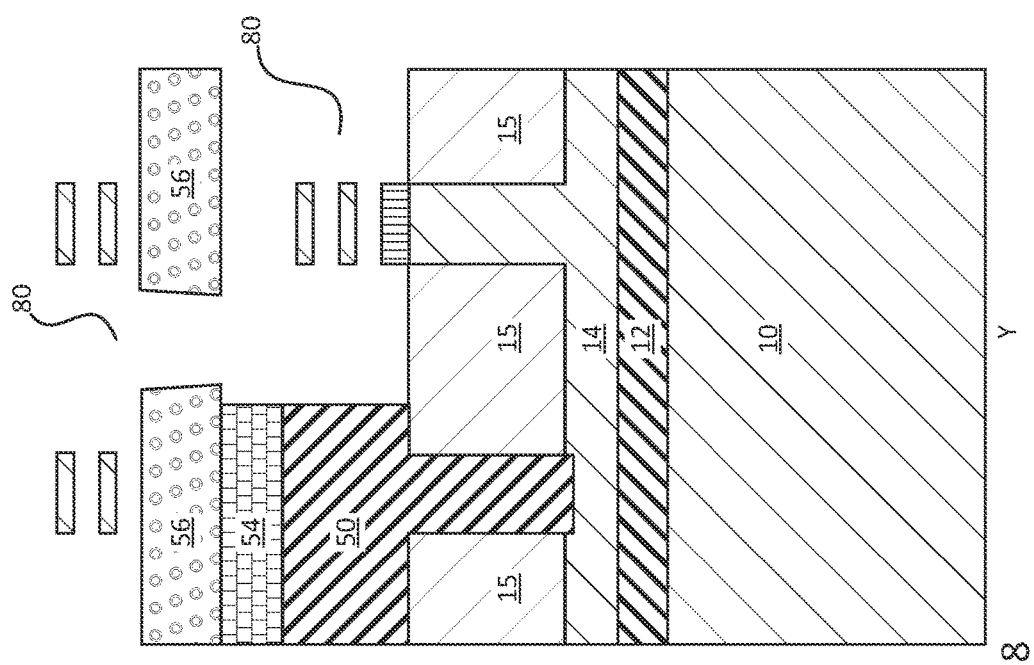
FIG. 8 is a cross-sectional view of the semiconductor structure of FIG. 7 where dummy gates and alternating sacrificial layers of the top and bottom nanosheet stacks are selectively removed, in accordance with an embodiment of the present invention.
Figure 8:
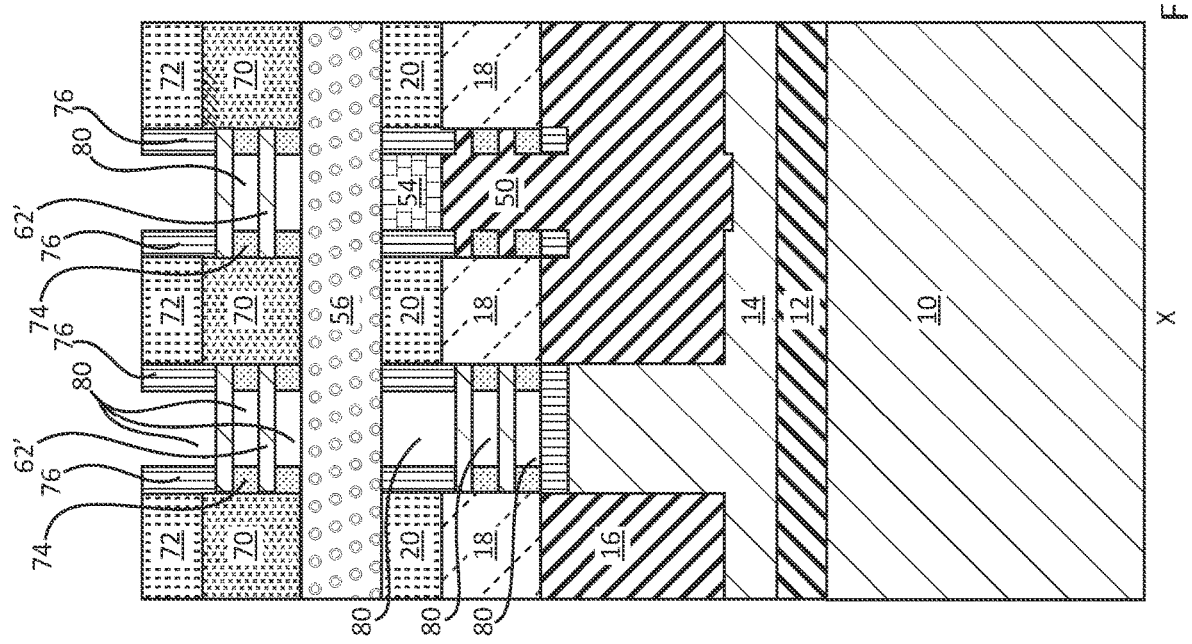

FIG. 8 is a cross-sectional view of the semiconductor structure of FIG. 7 where dummy gates and alternating sacrificial layers of the top and bottom nanosheet stacks are selectively removed, in accordance with an embodiment of the present invention.

In various example embodiments, the dummy gates 34, 78 and alternating sacrificial layers 24, 64' of the top and bottom nanosheet stacks 60', 25 are selectively removed to create openings 80. The openings 80 are formed on opposed ends of the Si layers 22, 62' of the top-stacked and bottom-stacked FETs.

Figure 9:
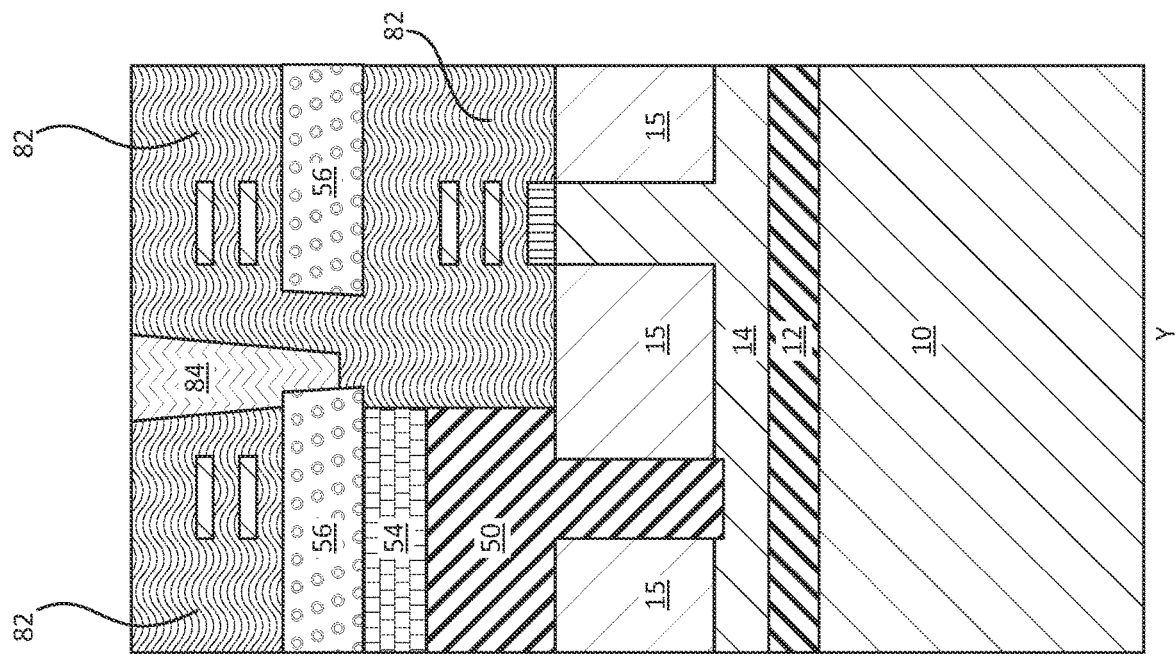
FIG. 9 is a cross-sectional view of the semiconductor structure of FIG. 8 where a high-k metal gate (HKMG) is deposited and a gate cut is performed, in accordance with an embodiment of the present invention.
Figure 9:
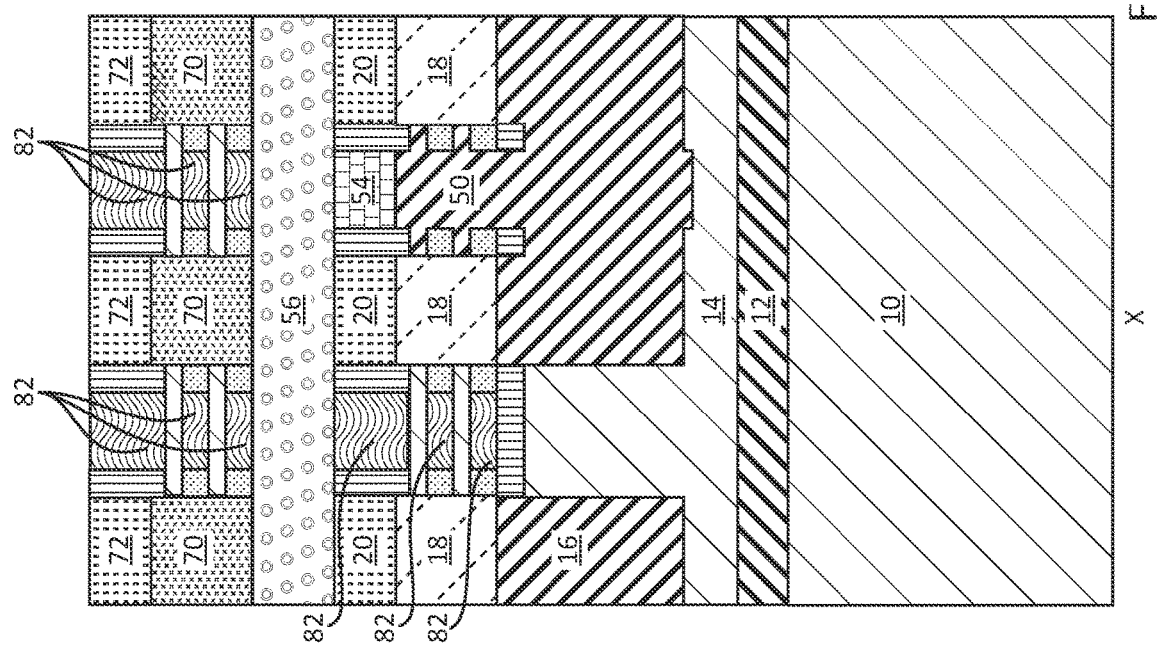

FIG. 9 is a cross-sectional view of the semiconductor structure of FIG. 8 where a high-k metal gate (HKMG) is deposited and a gate cut is performed, in accordance with an embodiment of the present invention.

In various example embodiments, a high-k metal gate (HKMG) 82 is deposited and a gate cut 84 is performed. The gate cut 84 is visible in the Y-cut direction. The gate cut 84 extends into the bonding dielectric layer 56. The gate cut 84 is formed through the HKMG 82. The gate cut 84 is vertically offset from the top and bottom nanosheet stacks 60', 25.

The HKMG material of the HKMG 82 can be deposited by any suitable techniques, such as ALD, CVD, metal-organic CVD (MOCVD), physical vapor deposition (PVD), thermal oxidation, combinations thereof, or other suitable techniques. The gate dielectric material of the HKMG 82 can include, e.g., $HfO_2$, LaO, AO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HTaO, HfTiO, $(Ba,Sr)TiO_3$ (BST), $Al_2O_3$, $Si_3N_4$, oxynitrides (SiON), or other suitable materials. The HKMG 82 further comprises work function metals, such as TiN, TiAl, TiC, TiAlC, etc., and conductive metal fills, such as W, Al, Ru, etc.

Figure 10:
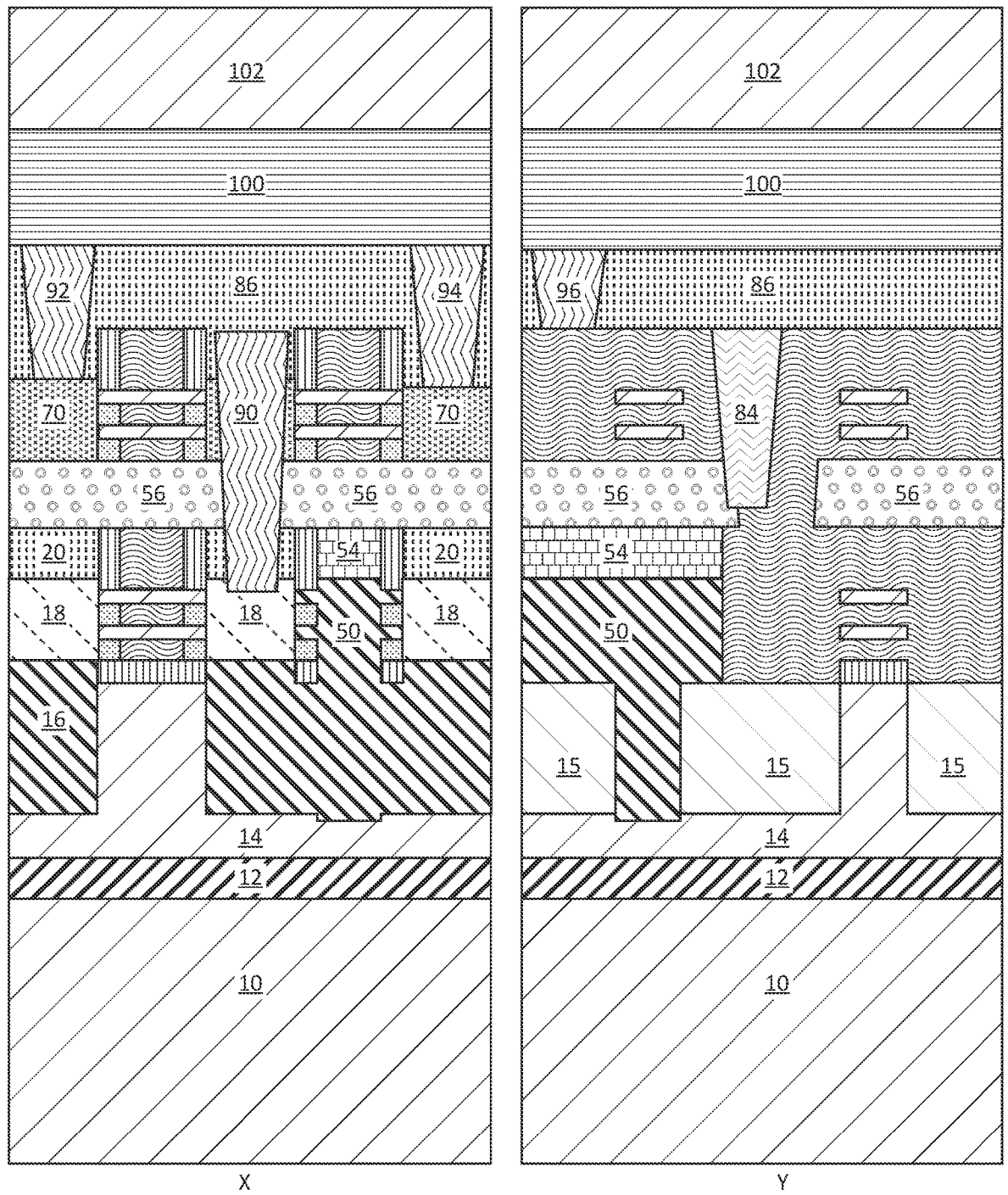
FIG. 10 is a cross-sectional view of the semiconductor structure of FIG. 9 where middle-of-line (MOL) contacts are formed, back-end-of-line (BEOL) components are formed, and a carrier wafer is bonded to the BEOL, in accordance with an embodiment of the present invention.

FIG. 10 is a cross-sectional view of the semiconductor structure of FIG. 9 where middle-of-line (MOL) contacts are formed, back-end-of-line (BEOL) components are formed, and a carrier wafer is bonded to the BEOL, in accordance with an embodiment of the present invention.

In various example embodiments, an ILD 86 is deposited and MOL contacts are formed. The MOL contacts can include, e.g., in the X-cut direction, a node contact 90, VSS pin 92, and bitline (BL) 94. The MOL contacts can include, e.g., in the Y-cut direction, wordline (WL) 96.

The node contact 90 advantageously extends through the bonding dielectric layer 56 and into the bottom S/D epi region 18. The VSS pin 92 extends to the top S/D epi region 70 and the BL extends to the top S/D epi region 70. The WL 96 is shown to extend to a top surface of the HKMG 82 in the Y-cut direction.

After formation of the MOL contacts, back-end-of-line (BEOL) components are formed, and a carrier wafer 102 is bonded to the BEOL 100.

Non-limiting examples of suitable conductive materials for the node contact 90, VSS pin 92, BL 94, and WL 96 include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

Figure 11:
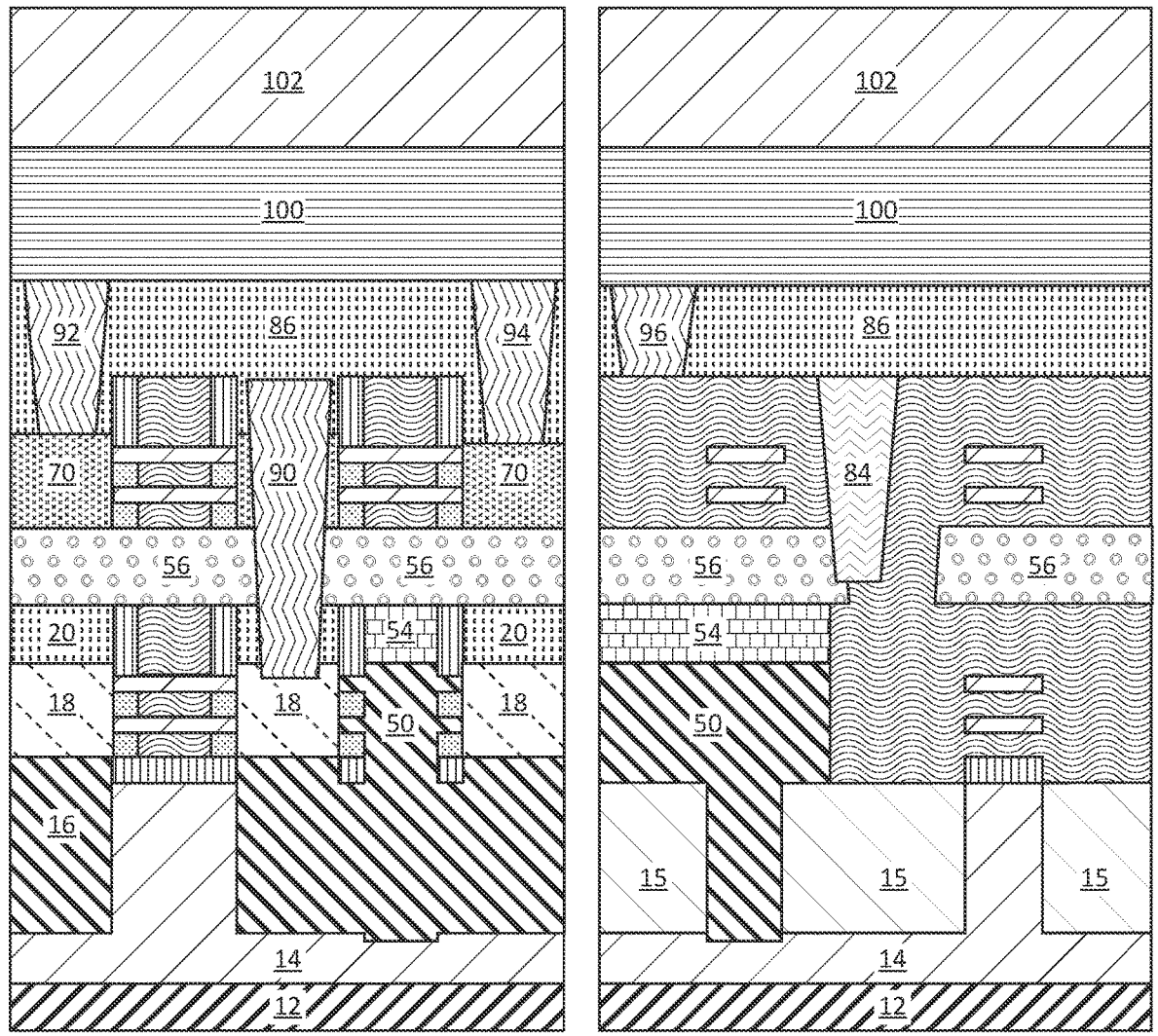
FIG. 11 is a cross-sectional view of the semiconductor structure of FIG. 10 where the wafer is flipped and the substrate is removed, in accordance with an embodiment of the present invention.

FIG. 11 is a cross-sectional view of the semiconductor structure of FIG. 10 where the wafer is flipped and the substrate is removed, in accordance with an embodiment of the present invention.

In various example embodiments, the wafer is flipped and the substrate 10 is removed to expose the etch stop layer 12.

Figure 12:
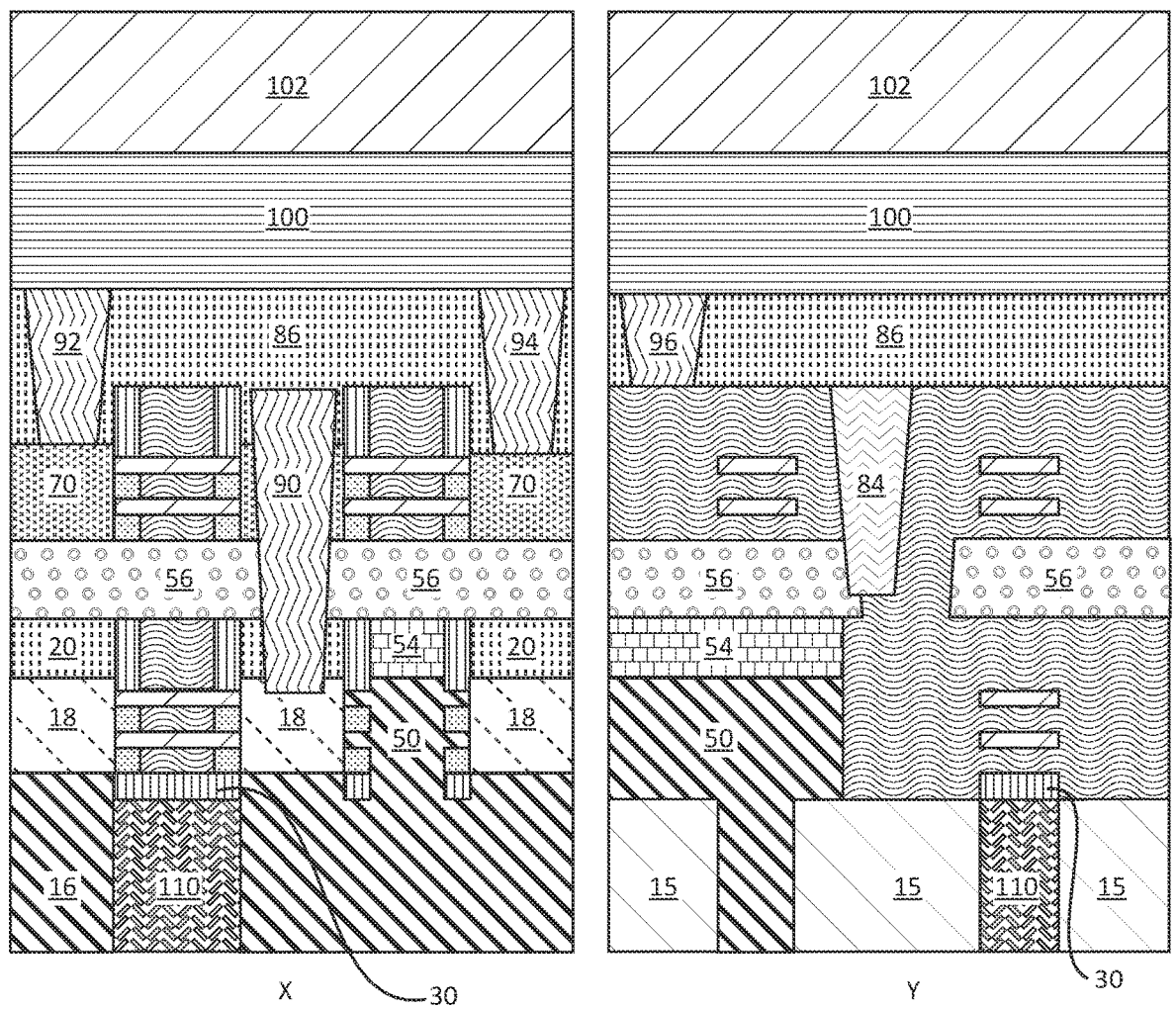
FIG. 12 is a cross-sectional view of the semiconductor structure of FIG. 11 where the etch stop layer and the remaining silicon (Si) layer are removed, and backside ILD is deposited, in accordance with an embodiment of the present invention.

FIG. 12 is a cross-sectional view of the semiconductor structure of FIG. 11 where the etch stop layer and the remaining silicon (Si) layer are removed, and backside ILD is deposited, in accordance with an embodiment of the present invention.

In various example embodiments, the etch stop layer 12 and the remaining silicon (Si) layer 14 are removed, and a backside ILD 110 is deposited. The backside ILD 110 directly contacts the BDI layer 30. The backside ILD 110 can be planarized by, e.g., CMP.

The backside ILD 110 can be any suitable material, such as, for example, porous silicates, carbon doped oxides, silicon dioxides, silicon nitrides, silicon oxynitrides, or other dielectric materials. Any known manner of forming the backside ILD 110 can be utilized. The backside ILD 110 can be formed using, for example, CVD, PECVD, ALD, flowable CVD, spin-on dielectrics, or PVD.

Figure 13:
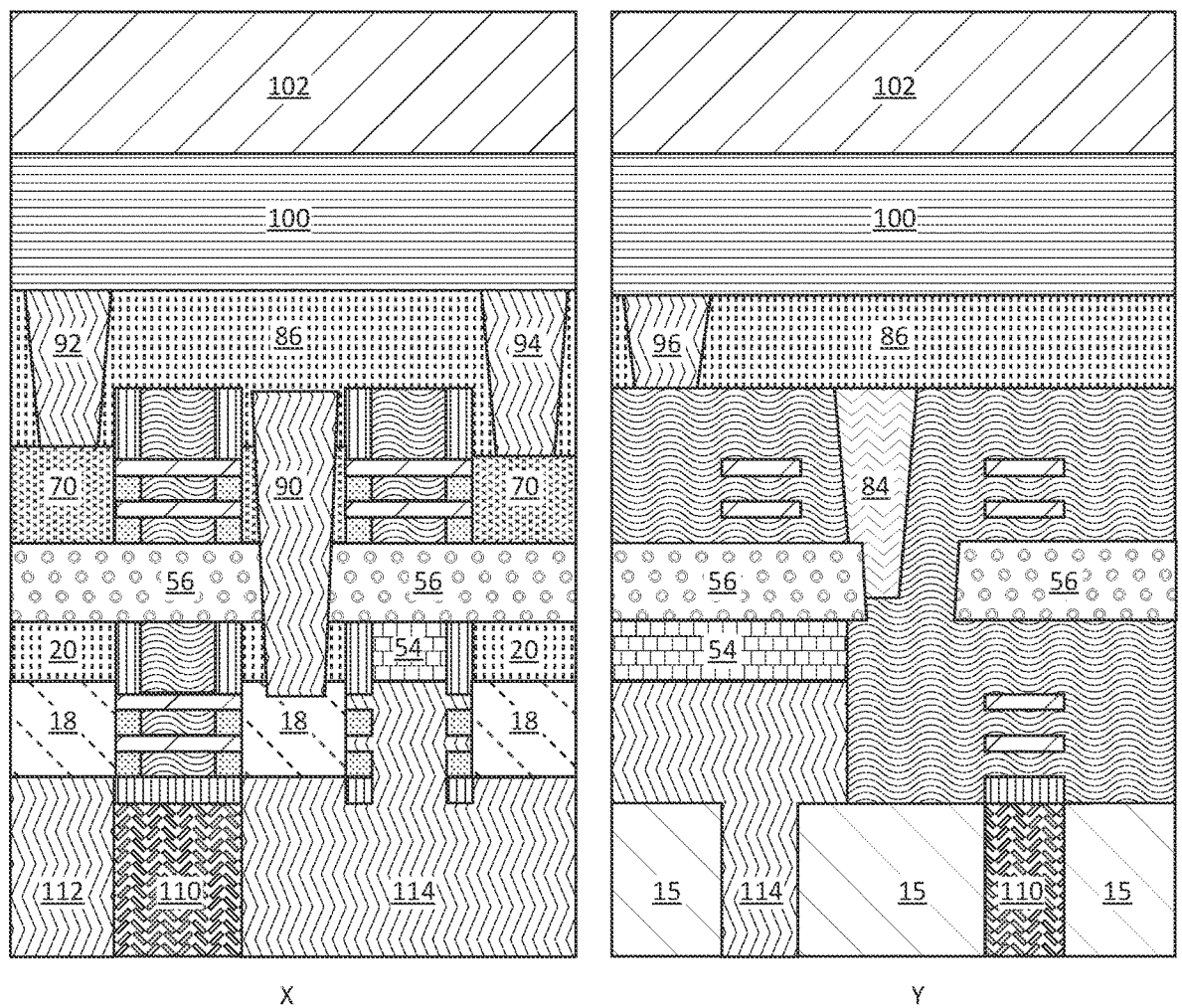
FIG. 13 is a cross-sectional view of the semiconductor structure of FIG. 12 where the sacrificial placeholders are selectively removed and backside contact metallization takes place, in accordance with an embodiment of the present invention.

FIG. 13 is a cross-sectional view of the semiconductor structure of FIG. 12 where the sacrificial placeholders are selectively removed and backside contact metallization takes place, in accordance with an embodiment of the present invention.

In various example embodiments, the bottom sacrificial placeholders 16 and the sacrificial material 50 are selectively removed and backside contact metallization takes place. In other words, the pFET channel under the pass gate is selectively removed. The removed pFET channel area, as well as the bottom of the pFET is replaced with a conductor or inverter gate 114. In particular, the metallization involves VDD pin 112 and the inverter gate 114. The VDD pin 112 and the inverter gate 114 directly contact the bottom S/D epi regions 18 and the gate cap 54 in the X-cut direction. In the Y-cut direction, the inverter gate 114 directly contacts the gate cap 54. The inverter gate 114 can also be referred to as a cross-couple. The inverter gate 114 is a conductor.

Figure 14:
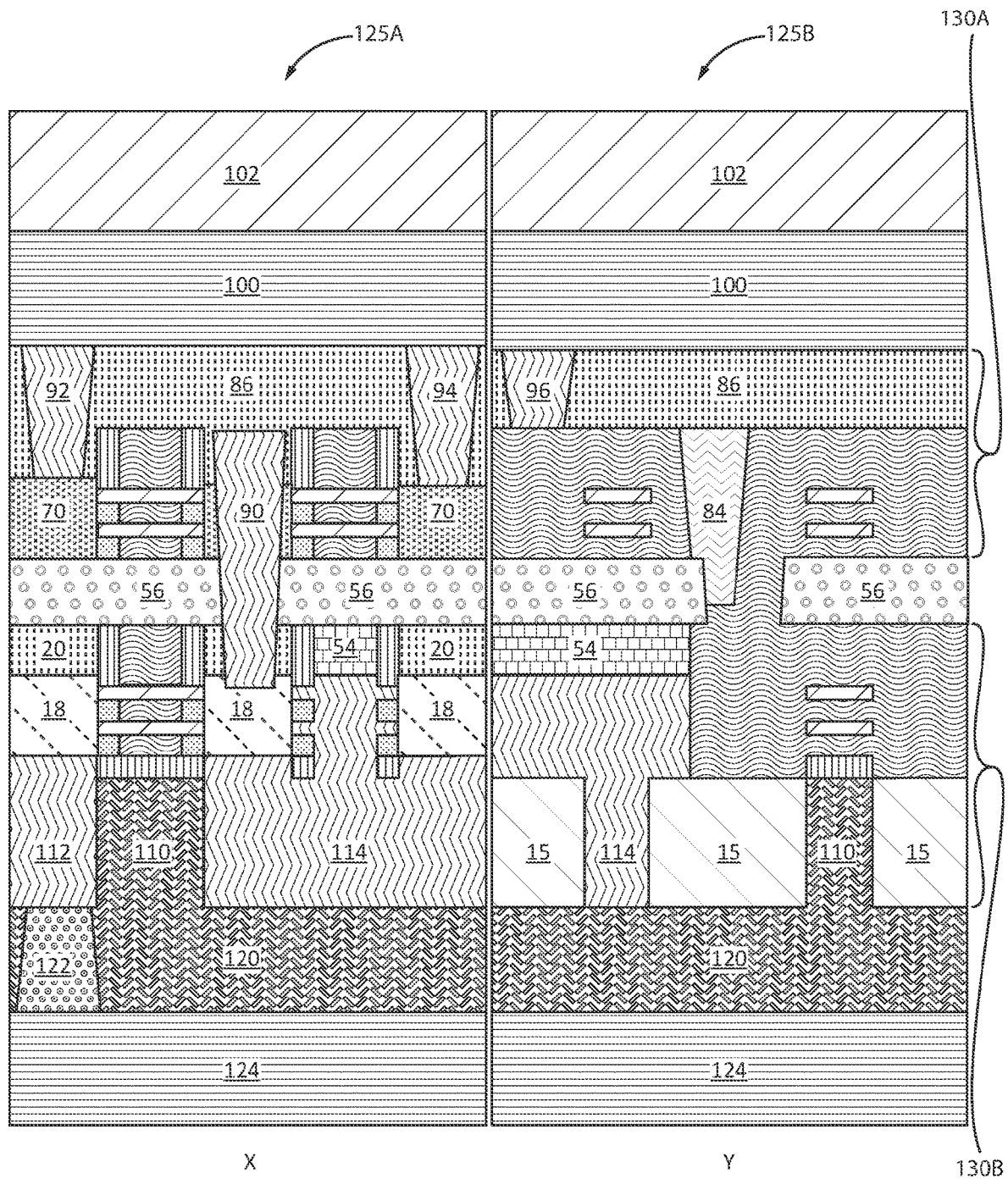
FIG. 14 is a cross-sectional view of the semiconductor structure of FIG. 13 where a backside power delivery network (BSPDN) is connected to the metal contacts, in accordance with an embodiment of the present invention.

FIG. 14 is a cross-sectional view of the semiconductor structure of FIG. 13 where a backside power delivery network (BSPDN) is connected to the metal contacts, in accordance with an embodiment of the present invention.

In various example embodiments, a backside power delivery network (BSPDN) 124 is connected to the metal contacts. First an ILD 120 is deposited, then a via 122 is formed through the ILD 120 to the top surface of the VDD pin 112, and then the BSPDN 124 is formed.

Structure 125A illustrates the stacked-FET SRAM cell in the X-cut direction and structure 125B illustrates the stacked-FET SRAM cell in the Y-cut direction. The stacked-FET cell advantageously includes a top FET portion 130A and a bottom FET portion 130B, where the bottom FET portion 130B advantageously includes the node contact 90 and the inverter gate 114. Therefore, the exemplary embodiments present a stacked-FET SRAM with a bottom pFET by electrically connecting the node contact 90 and the inverter gate 114 (cross-couple) by replacing the pFET under the pass-gate by a conductor.

Further regarding FIG. 14, structures 125A, 125B depict the bottom FET 130B including a plurality of bottom source/drain (S/D) epi regions 18, the top FET 130A including a plurality of top S/D epi regions 70, a bonding dielectric layer 56 disposed directly between the bottom FET 130B and the top FET 130A, and the node contact 90 advantageously extending from the bottom S/D epi region 18 of the plurality of bottom S/D epi regions of the bottom FET 130B through the bonding dielectric layer 56 and into the top FET 130A. Stated differently, the bonding dielectric layer 56 is disposed directly between the bottom FET 130B and the top FET 130A and the node contact 90 advantageously extends from the bottom FET 130B through the bonding dielectric layer 56 and into the top FET 130A to advantageously electrically connect to the inverter gate 114.

The bottom FET 130B includes the inverter gate 114. The inverter gate 114 directly contacts the gate cap 54 of the bottom FET 130B. The inverter gate 114 directly contacts several of the plurality of bottom S/D epi regions 18. The node contact 90 is advantageously vertically aligned with a portion of the inverter gate 114. The top FET 130A electrically connects to BEOL components and the bottom FET 130B electrically connects to a backside power delivery network (BSPDN) 124. The bitline (BL) 94 advantageously directly contacts a top S/D epi region 70 of the plurality of top S/D epi regions and the wordline (WL) 96 advantageously directly contacts the high-k metal gate (HKMG) 82 disposed in the top FET 130A. Moreover, the node contact 90 is vertically offset from the BL 94 and the WL 96.

In conclusion, the exemplary embodiments of the present invention present a stacked FET architecture that includes a top FET bonded to a bottom FET by a bonding dielectric layer. The bottom FET advantageously includes the node contact and the inverter gate, such that all the transistor physical parameters, such as gate length, spacer thickness, and contact size, can be advantageously optimized for better transistor speed and/or lower power. Unlike horizontal transistors, much of this structural tuning is beneficial because it doesn't affect the transistor pitch (distance between transistors). In the exemplary stacked FETs with nanosheets according to FIGS. 1-14, integrated circuit (IC) vendors advantageously have the ability to vary the widths of the nanosheets in the transistor. For example, a nanosheet with a wider sheet provides more drive current and performance. A narrow nanosheet has less drive current, but takes up a smaller area.

Regarding FIGS. 1-14, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures providing for constructing a stacked field effect transistor (FET) static random access memory (SRAM) cell with bottom pFET (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
   a bottom field effect transistor (FET) including a plurality of bottom source/drain (S/D) epi regions;
   a top FET including a plurality of top S/D epi regions;
   a bonding dielectric layer disposed directly between the bottom FET and the top FET, a bottom surface of the bonding dielectric layer directly contacting a top surface of a gate metal of the bottom FET; and
   a node contact extending from a bottom S/D epi region of the plurality of bottom S/D epi regions of the bottom FET through the bonding dielectric layer and into the top FET.

2. The semiconductor structure of claim 1, wherein the bottom FET includes an inverter gate.

3. The semiconductor structure of claim 2, wherein a gate cap is disposed on top of a bottom pFET gate metal.

4. The semiconductor structure of claim 2, wherein the inverter gate directly contacts several of the plurality of bottom S/D epi regions.

5. The semiconductor structure of claim 2, wherein the node contact is vertically aligned with a portion of the inverter gate.

6. The semiconductor structure of claim 1, wherein the top FET electrically connects to back-end-of-line (BEOL) components and wherein the bottom FET electrically connects to a backside power delivery network (BSPDN).

7. The semiconductor structure of claim 1, wherein a bitline (BL) directly contacts a top S/D epi region of the plurality of top S/D epi regions.

8. The semiconductor structure of claim 7, wherein a wordline (WL) directly contacts a metal gate disposed in the top FET.

9. The semiconductor structure of claim 8, wherein a gate cap directly contacts a cross-couple in the bottom FET.

10. A semiconductor structure comprising:
    a bonding dielectric layer disposed directly between a bottom field effect transistor (FET) and a top FET, a bottom surface of the bonding dielectric layer directly contacting a top surface of a gate metal of the bottom FET; and
    a node contact extending from the bottom FET through the bonding dielectric layer and into the top FET to electrically connect to an inverter gate.

11. The semiconductor structure of claim 10, wherein a gate cap is disposed on top of a bottom pFET gate metal.

12. The semiconductor structure of claim 10, wherein the inverter gate directly contacts several of a plurality of bottom S/D epi regions of the bottom FET.

13. The semiconductor structure of claim 10, wherein a gate cap directly contacts a cross-couple in the bottom FET.

14. The semiconductor structure of claim 10, wherein the top FET electrically connects to back-end-of-line (BEOL)

components and wherein the bottom FET electrically connects to a backside power delivery network (BSPDN).

15. The semiconductor structure of claim 10, wherein a bitline (BL) directly contacts a top S/D epi region of the top FET.

16. The semiconductor structure of claim 10, wherein a wordline (WL) directly contacts a metal gate disposed in the top FET.

* * * * *